United States Patent
Yagi et al.

(10) Patent No.: US 8,657,455 B2
(45) Date of Patent: Feb. 25, 2014

(54) LED LAMP

(75) Inventors: Toshi Yagi, Shizuoka (JP); Masato Gomi, Shizuoka (JP); Hisayoshi Daicho, Shizuoka (JP)

(73) Assignee: Koito Manufacturing Co., Ltd., Tokyo (JP)

(*) Notice: Subject to any disclaimer, the term of this patent is extended or adjusted under 35 U.S.C. 154(b) by 6 days.

(21) Appl. No.: 13/410,713

(22) Filed: Mar. 2, 2012

(65) Prior Publication Data

US 2012/0224352 A1 Sep. 6, 2012

(30) Foreign Application Priority Data

Mar. 4, 2011 (JP) ................................. 2011-047043

(51) Int. Cl.
*F21V 33/00* (2006.01)

(52) U.S. Cl.
USPC ..................... 362/84; 362/311.02; 362/800

(58) Field of Classification Search
USPC .................... 362/249.02, 311.02, 800, 84
See application file for complete search history.

(56) References Cited

U.S. PATENT DOCUMENTS

| 2008/0232119 A1* | 9/2008 | Ribarich ........................ 362/373 |
| 2009/0180273 A1* | 7/2009 | Kim et al. ........................ 362/84 |
| 2011/0157896 A1* | 6/2011 | Yu ................................. 362/293 |
| 2011/0221322 A1* | 9/2011 | Lai ................................. 313/46 |

FOREIGN PATENT DOCUMENTS

| JP | 10107325 A | 4/1998 |
| JP | 2010-033959 A | 2/2010 |

OTHER PUBLICATIONS

English Patent Abstract of JP 10-107325 from esp@cenet, Publication Date: Apr. 24, 1998 (2 Pages).
English patent Abstract of JP 2010-033959 from esp@cenet, Publication Date Feb. 12, 2010 (2 Pages).

* cited by examiner

*Primary Examiner* — Laura Tso
(74) *Attorney, Agent, or Firm* — Osha Liang LLP

(57) ABSTRACT

An LED lamp has a lamp body, a base provided on one end of the lamp body, a light transmissive cover provided on an opposite side of the lamp body from the base, a light source substrate disposed inside the light transmissive cover, and at least one LED unit mounted on the light source substrate. The LED unit has an LED chip and a light transmissive encapsulant encapsulating the LED chip. The LED chip is mounted on the light source substrate. The encapsulant is molded such that the encapsulant is raised from the light source substrate. The LED unit radiates light from an entire surface of the encapsulant in an angular range including a region around a periphery of the LED unit.

5 Claims, 6 Drawing Sheets

LED LAMP

CROSS-REFERENCE TO RELATED APPLICATIONS

The present application claims priority from Japanese Patent Application No. 2011-047043 filed on Mar. 4, 2011, the entire content of which is incorporated herein by reference.

BACKGROUND OF INVENTION

1. Field of the Invention

The present invention relates to a light emitting diode (LED) lamp including an LED unit mounted on a light source substrate.

2. Related Art

A related art LED lamp has a shape like an incandescent lamp. The LED lamp has a lamp body, a base provided on one end of the lamp body, a light source substrate provided on the opposite side of the lamp body from the base, an LED unit mounted on the light source substrate, and a light transmissive cover arranged to cover the LED unit. The LED unit has an LED chip that emits blue light, and a resin portion that covers the LED chip. Phosphors absorbing a part of the blue light and emitting yellow light are mixed in the resin portion, so that the LED unit emits white light by the mixture of the blue light and the yellow light (see, e.g., JP 2010-033959 A).

According to another related art, an LED unit has an LED chip that emits blue light, an encapsulation resin containing yellow light emitting phosphors, and a cup-shaped opaque container accommodating the LED chip and the encapsulation resin. The inner surface of the container is configured as a reflecting surface to enhance light mixture of multiple colors, thereby radiating white visible light having a strong directivity (see, e.g., JP 10-107325 A).

According to an LED unit configured to intensify the directivity of visible light, the amount of light from the LED chip toward the circumference of the LED unit is low, resulting in low illuminance in the region lateral to the lamp. For example, as illustrated in FIG. 6, with respect to 1 being the illuminance in the radiation angle of 0° (directly below the lamp unit), relative illuminance lowers as the radiation angle becomes wide, and may become 0 in the radiation angle of 90° (directly lateral to the lamp unit).

SUMMARY OF INVENTION

One or more embodiments of the present invention provides an LED lamp having an LED unit that emits sufficient amount of light from a circumference from the LED unit, and providing high illuminance in the region lateral to the lamp.

According to one or more embodiments of the present invention, an LED lamp is provided. The LED lamp includes a lamp body, a base provided on one end of the lamp body, a light transmissive cover provided on an opposite side of the lamp body from the base, a light source substrate disposed inside the light transmissive cover, and at least one LED unit mounted on the light source substrate. The LED unit has an LED chip and a light transmissive encapsulant encapsulating the LED chip. The LED chip is mounted on the light source substrate. The encapsulant is molded such that the encapsulant is raised from the light source substrate. The LED unit radiates light from an entire surface of the encapsulant in an angular range including a region around a periphery of the LED unit.

Other aspects and advantages of the invention will be apparent from the following description, the drawings and the claims.

DETAILED DESCRIPTION

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
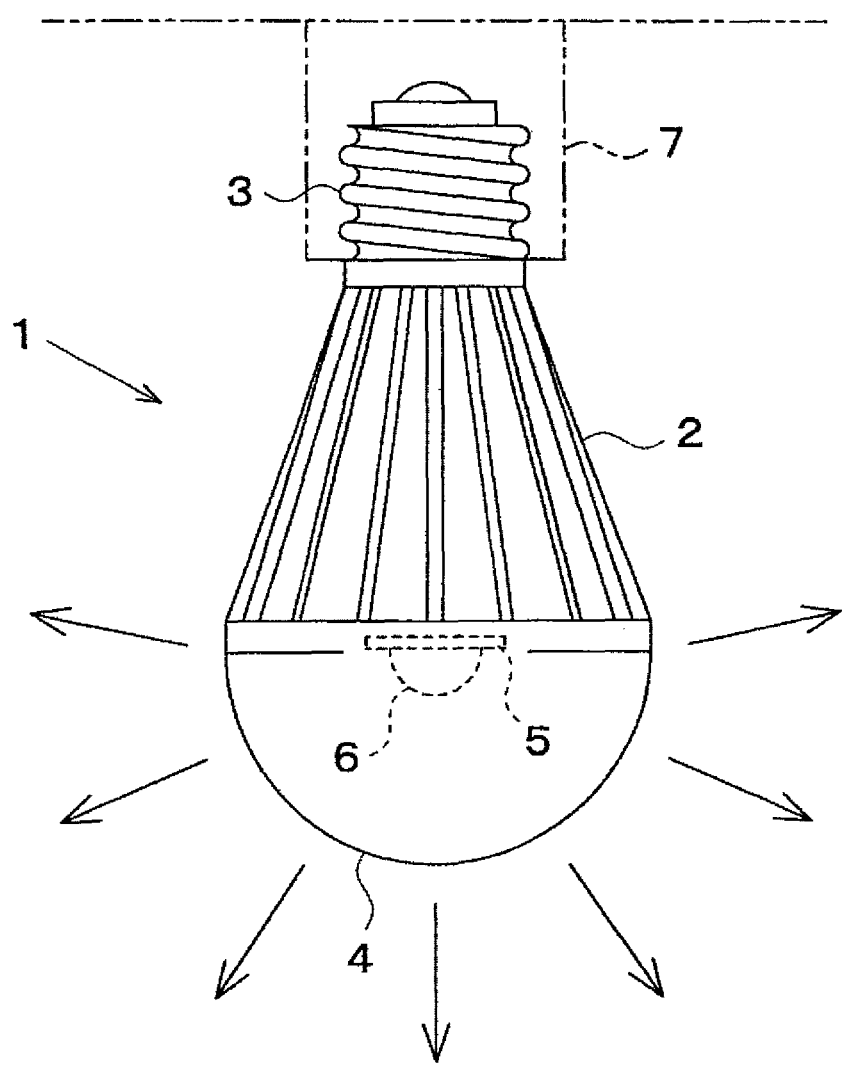
FIG. 1 is a lateral view of an LED lamp according to one or more embodiments of the present invention.

As shown in FIG. 1, an LED lamp 1 according to one or more embodiments of the present invention has a lamp body 2 functioning as a heat sink, a base 3 provided on one end of the lamp body 2, and a light transmissive cover 4 attached to the opposite side of the lamp body 2 from the base 3. A light source substrate 5 is disposed inside the light transmissive cover 4. An LED unit 6 is mounted on the light source substrate 5. The base 3 is adapted to be attached to a socket 7 provided on a ceiling or the like, so that the LED unit 6 radiates white visible light over a wide range inside the room through the light transmissive cover 4.

Figure 2:
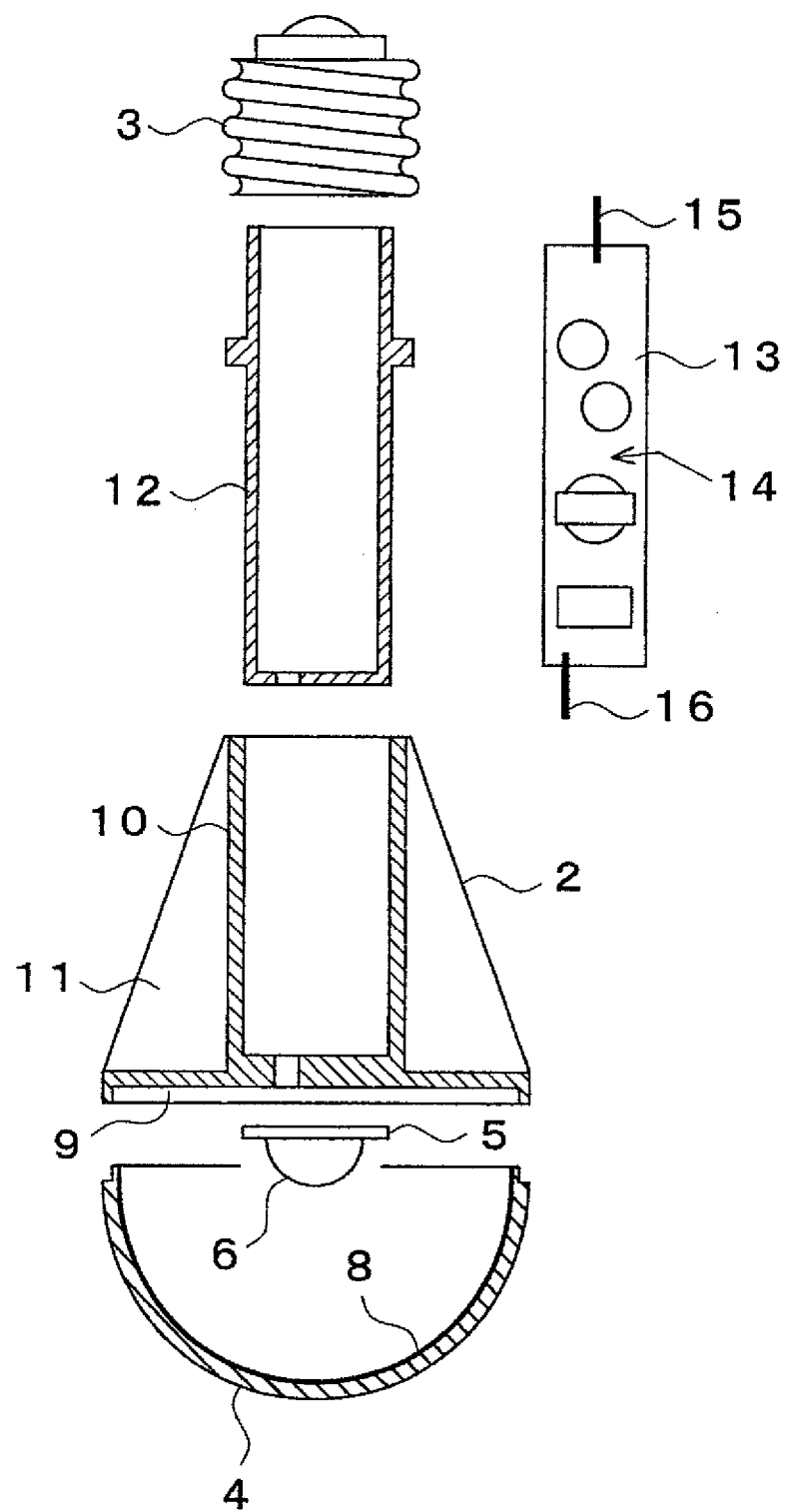
FIG. 2 is an exploded and partially sectional view of the LED lamp.
Figure 3:
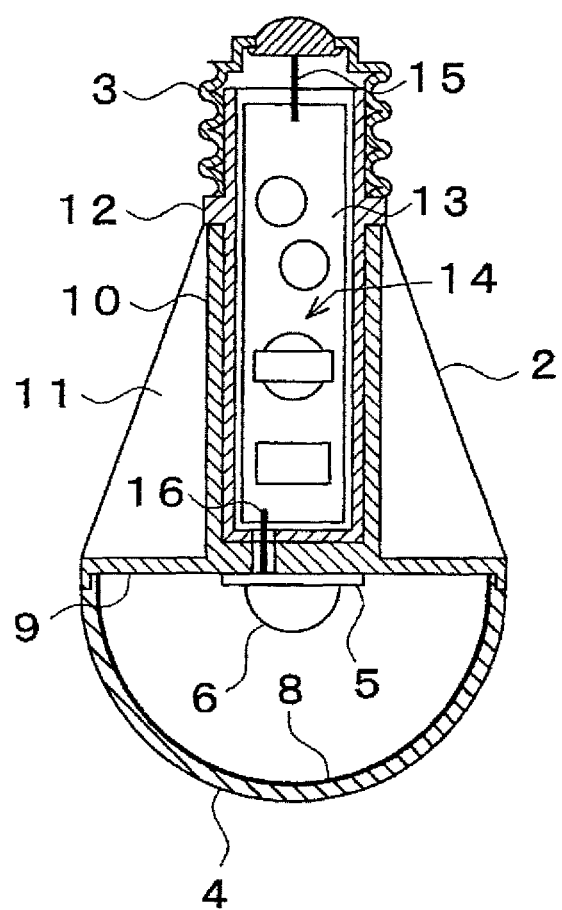
FIG. 3 is a sectional view of the LED lamp in an assembled state.

As shown in FIGS. 2 and 3, the inner surface of the light transmissive cover 4 is coated with a light diffusing layer 8. Alternatively, the light transmissive cover 4 may be molded from light diffusion grade resin. The lamp body 2 includes an end surface portion 9, a hollow portion 10, and a heat dissipating portion 11. The lamp body 2 is made of metal material, such as aluminum, by molding. The light transmissive cover 4 and light source substrate 5 are mounted on the end surface portion 9. A circuit board 13 is accommodated inside the hollow portion 10 via a resin-made insulating case 12. A power circuit 14 provided on the circuit board 13 is connected to the base 3 via a lead wire 15 and to the light source substrate 5 via a lead wires 16, and converts commercial alternating-current power into direct-current voltage for power supply to the LED unit 6. The lead wire 16 extends through a through hole in the end surface portion 9, and abuts the light source substrate 5.

Figure 4:
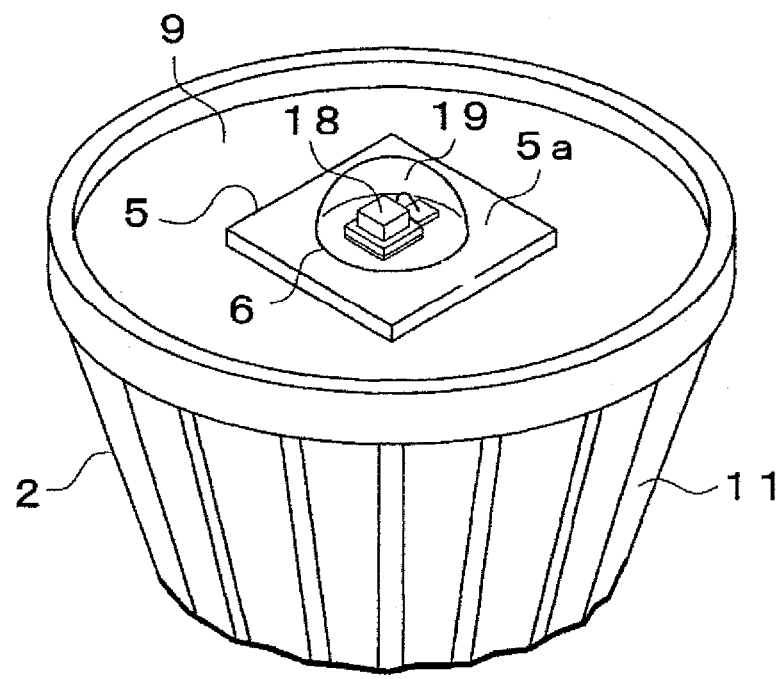
FIG. 4 is a perspective view of a portion of the LED lamp, illustrating an LED unit of the LED lamp.
Figure 5:
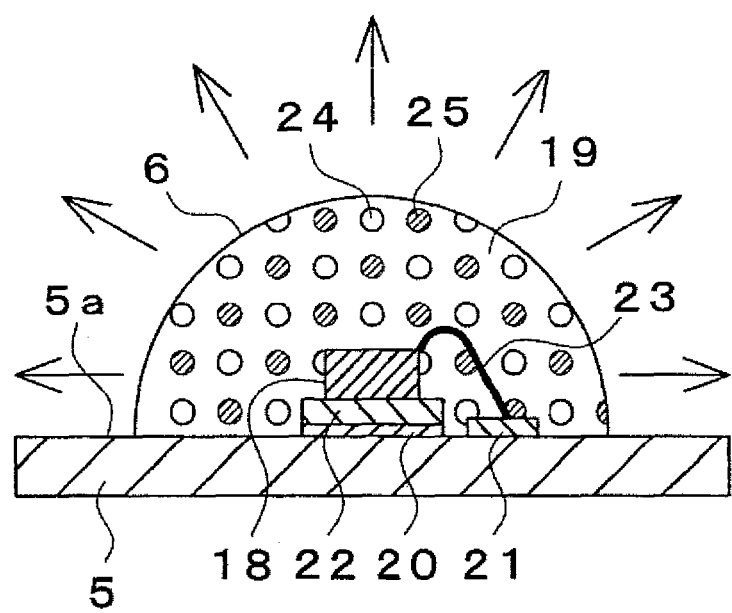
FIG. 5 is a sectional view of the LED unit.

As shown in FIGS. 4 and 5, the LED unit 6 includes an LED chip 18 that emits ultraviolet or near ultraviolet visible light, and a light transmissible encapsulant 19 encapsulating the LED chip 18. The LED chip 18 is mounted on the light source substrate 5, which is made of aluminum nitride. An anode 20 (a first electrode) and a cathode 21 (a second electrode) are provided on the chip mounting surface 5a of the light source substrate 5 by Au plating, and, the LED chip 18 is mounted on the anode 20 via an Ag paste 22. The LED chip 18 is a semiconductor light emitting device having a light emission peak in the wavelength range of 380 nanometers (nm) to 420 nm. An upper surface of the LED chip 18 is connected to the cathode 21 via an Au wire 23. The encapsulant 19 encapsulates the Au wire 23 together with the LED chip 18.

The encapsulant 19 is made of transparent silicone resin, and is molded such that the encapsulant 19 is raised from the chip mounting surface 5a of the light source substrate 5. The encapsulant 19 is bonded to the chip mounting surface 5a at a bottom surface of the encapsulant 19, and its entire surface, except the bottom surface, is exposed to allow the LED unit 6 to radiate light from the entire surface of the encapsulant 19 in a wide angular range including the region around the periphery of the LED unit 6. According to one or more embodiments illustrated in the drawings, the encapsulant 19 is molded in a hemispherical dome shape, and the lateral-view projected area of the encapsulant 19 is about 50% of the plan-view projected area of the encapsulant 19. The raised shape of the encapsulant 19 is not limited to the dome shape, and may be molded in other shapes such that the lateral-view projected area is within a range of 30% to 125% of the plan-view projected area. The lower limit 30% is a rate at which relative illuminance of 0.5 can be obtained at the radiation angle of 70°, which is equivalent to the incandescent lamp. The upper limit 125% is a rate at which illuminance at the radiation angle of 0° is substantially equal to illuminance at the radiation angle of 90°, i.e., apparent brightness of the LED lamp is the same regardless of the angle of view.

The encapsulant 19 contains a plurality of kinds of phosphors for wavelength conversion from the ultraviolet or near ultraviolet visible light emitted by the LED chip 18 to visible white light. According to one or more embodiments of the present invention, two kinds of phosphors 24, 25 are contained in the encapsulant 19. The first phosphor 24 absorbs the light emitted by the LED chip 18, and emits blue visible light having a peak wavelength in the range of 560 nm to 600 nm. The second phosphor 25 absorbs the light emitted by the LED chip 18, and emits yellow visible light having a peak wavelength in the range of 430 nm to 480 nm. The first and second phosphors 24, 25 are dispersed uniformly in the silicone resin, and by the mixture of blue and yellow lights, which are complementary colors, the encapsulant 19 emits white visible light in a Lambertian manner from the entire surface of the encapsulant 19.

The LED lamp 1 described above is advantageous in, for example, the following aspects.

The encapsulant 19 of the LED unit 6 is molded such that the encapsulant 19 is raised from the chip mounting surface 5a of the light source substrate 5. Thus, the LED unit 6 can radiate light in a wide angular range including the region around the periphery of the LED unit 6. Therefore, as shown in FIG. 1, high illuminance can be provided in the region lateral to the LED lamp 1.

Figure 6:
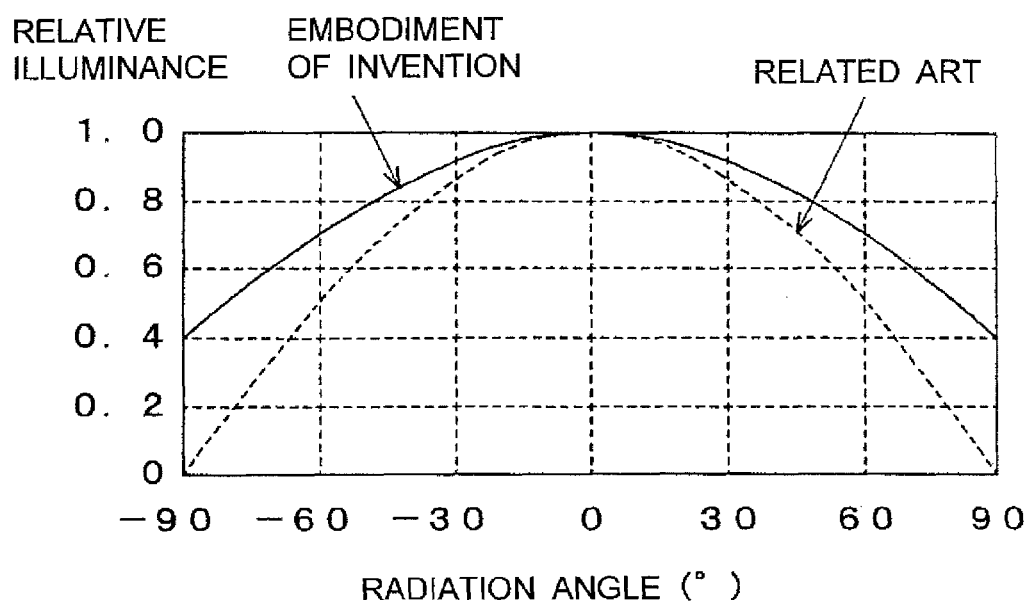
FIG. 6 is a diagram illustrating a light distribution pattern of an LED unit according to one or more embodiments of the present invention and a light distribution pattern of a related art LED unit.

The encapsulant 19 is molded in a hemispherical dome shape such that its lateral-view projected area is about 50% of its plan-view projected area. Thus, as shown in FIG. 6, the LED lamp 1 can provide the relative illuminance of 0.4 at a radiation angle of 90°, thereby providing a light distribution pattern that is substantially equivalent to an existing incandescent lamp.

The encapsulant 19 is provided such that a plurality of kinds of phosphors are uniformly distributed in the transparent silicone resin. Thus, the ultraviolet or near ultraviolet visible light emitted by the LED chip 18 can be wavelength-converted to visible white light efficiently, color fluctuations of light emission in a region around the periphery of the LED unit 6 can be suppressed, and a wide range can be brightly illuminated with uniform white visible light.

The yellow light emitting second phosphor 25 hardly absorbs the blue light from the first phosphor 24. Thus, despite the raised shape of the encapsulant 19, color fluctuations in the emitted light resulting from multiple excitation (cascade excitation) can be suppressed.

The light diffusing layer 8 is provided on the inner surface of the light transmissive cover 4. Thus, the light emitted by the LED unit 6 is efficiently and uniformly diffused in the region around the LED lamp 1.

While description has been made in connection with certain embodiments of the present invention, it will be obvious to those skilled in the art that various changes and modification may be made therein without departing from the present invention as defined by the appended claims.

Figure 7:
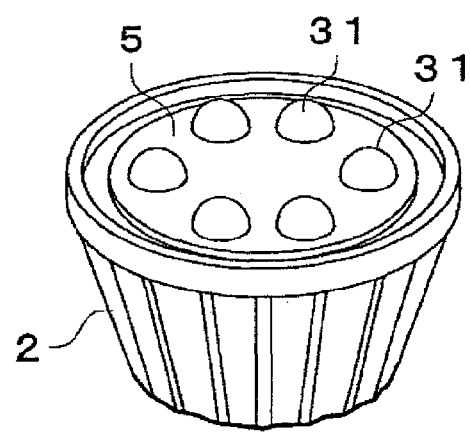
FIG. 7 is a perspective view of a portion of an LED lamp according to one or more embodiments of the present invention.

For example, the number of LED units is not limited. In a case in which a plurality of LED units are provided, as shown in FIG. 7, it is advantageous that the LED units 31 are arranged in a circular manner so that visible light is distributed uniformly along the periphery of the lamp 1.

Figure 8:
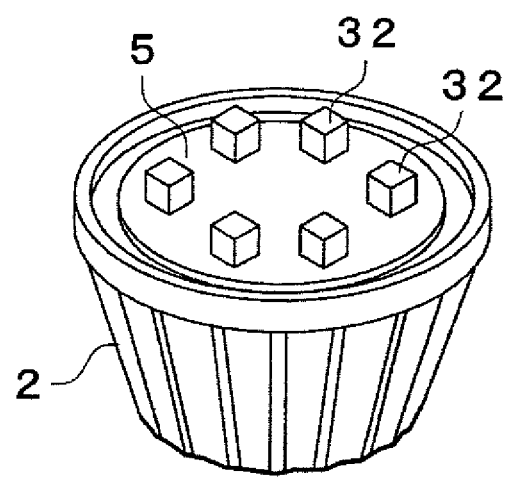
FIG. 8 is a perspective view of a portion of another LED lamp according to one or more embodiments of the present invention.

Further, as shown in FIG. 8, the encapsulant of LED units 32 can be formed in a cube shape or in a prism shape. The encapsulant may also be formed in other various raised shapes such as a cylindrical shape, a cone shape, a truncated cone shape, a pyramid shape, and a polyhedron shape.

What is claimed is:

1. An LED lamp comprising:
   a lamp body;
   a base provided on one end of the lamp body;
   a light transmissive cover provided on an opposite side of the lamp body from the base;
   a light source substrate disposed inside the light transmissive cover; and
   at least one LED unit mounted on the light source substrate,
   wherein the LED unit comprises an LED chip and a light transmissive encapsulant encapsulating the LED chip,
   wherein the LED chip is mounted on the light source substrate,
   wherein the encapsulant is molded such that the encapsulant is raised from the light source substrate,
   wherein the LED unit radiates light from an entire surface of the encapsulant in an angular range including a region around a periphery of the LED unit,
   wherein a lateral-view projected area of the encapsulant is 30% to 125% of a plan-view projected area of the encapsulant,
   wherein the LED chip emits ultraviolet or near ultraviolet visible light, and the encapsulant contains a plurality of kinds of phosphors to wavelength-convert the light emitted by the LED chip to white visible light, and
   wherein the plurality of kinds of phosphors includes a first phosphor which absorbs the light emitted by the LED chip and emits blue visible light having a peak wavelength in a range of 560 nm to 600 nm, and a second phosphor which absorbs the light emitted by the LED chip and emits yellow visible light having a peak wavelength in a range of 430 nm to 480 nm.

2. The LED lamp according to claim 1, wherein a plurality of said LED units are arranged on the light source substrate in a circular manner.

3. The LED lamp according to claim 1, further comprising a light diffusing layer provided on an inner surface of the light transmissive cover.

4. The LED lamp according to claim 1, further comprising:
a first electrode provided on the light source substrate; and
a second electrode provided on the light source substrate,
wherein the LED unit further comprises a wire connecting the LED chip and the second electrode,
wherein the LED chip is mounted on the first electrode, and
wherein the encapsulant encapsulates the wire together with the LED chip.

5. The LED lamp according to claim 1, further comprising:
a circuit board having a power circuit; and
a wire connecting the power circuit and the light source substrate to supply power to the LED unit,
wherein the lamp body comprises a hollow portion in which the circuit board is accommodated and a surface portion having a through hole,
wherein the light source substrate is mounted on the surface portion, and
wherein the wire extends through the through hole and abuts the light source substrate.

\* \* \* \* \*